United States Patent
Jammy et al.

(10) Patent No.: US 6,399,490 B1
(45) Date of Patent: Jun. 4, 2002

(54) HIGHLY CONFORMAL TITANIUM NITRIDE DEPOSITION PROCESS FOR HIGH ASPECT RATIO STRUCTURES

(75) Inventors: Rajarao Jammy, Wappingers Falls; Cheryl G. Faltermeier, Lagrange; Uwe Schroeder, Fishkill; Kwong Hon Wong, Wappingers Falls, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/607,131

(22) Filed: Jun. 29, 2000

(51) Int. Cl.[7] .................. H01L 21/44; C23C 16/06; C23C 16/14
(52) U.S. Cl. ............... 438/680; 438/668; 438/685; 427/255.36; 427/255.391; 427/585
(58) Field of Search ................... 438/648, 680, 438/683, 685, 668; 427/585, 588, 255.36, 255.391

(56) References Cited

U.S. PATENT DOCUMENTS

| | | |
|---|---|---|
| 4,897,709 A * | 1/1990 | Yokoyama et al. ........... 357/68 |
| 5,192,589 A | 3/1993 | Sandhu .................... 427/255.1 |
| 5,378,501 A | 1/1995 | Foster et al. ............. 427/255.2 |
| 5,393,565 A | 2/1995 | Suzuki et al. ............ 427/255.2 |
| 5,418,180 A | 5/1995 | Brown ......................... 437/60 |
| 5,462,895 A * | 10/1995 | Chen ......................... 437/200 |
| 5,525,543 A * | 6/1996 | Chen ......................... 437/190 |
| 5,610,106 A | 3/1997 | Foster et al. ................ 437/245 |
| RE35,785 E | 5/1998 | Sandhu et al. .............. 438/681 |
| 5,840,628 A | 11/1998 | Miyamoto .................. 438/680 |
| 5,908,947 A | 6/1999 | Vaarstra ....................... 556/42 |
| 5,918,149 A | 6/1999 | Besser et al. ............... 438/680 |
| 6,037,252 A | 3/2000 | Hilman et al. .............. 438/637 |

* cited by examiner

Primary Examiner—Alexander G. Ghyka
(74) Attorney, Agent, or Firm—Ratner & Prestia; H. Daniel Schnurmann

(57) ABSTRACT

Process for forming highly conformal titanium nitride on a silicon substrate. A gaseous reaction mixture of titanium tetrachloride and ammonia is passed over the semiconductor substrate surface maintained at a temperature of about 350° C. to about 800° C. The ratio of titanium tetrachloride to ammonia is about 5:1 to 20:1. The high degree of conformality achieved by the process of the invention allows TiN layers to be deposited on structures with high aspect ratios and on complicated, three-dimensional structures without forming a large seam or void.

22 Claims, 6 Drawing Sheets

HIGHLY CONFORMAL TITANIUM NITRIDE DEPOSITION PROCESS FOR HIGH ASPECT RATIO STRUCTURES

TECHNICAL FIELD

The present invention relates generally to integrated circuit manufacture. In particular, the present invention relates to a process for depositing highly conformal titanium nitride films by chemical vapor deposition.

BACKGROUND OF THE INVENTION

Titanium nitride (TiN) is an important material, having a number of applications, in the processes used to manufacture integrated circuits (ICs). Thin-film TiN is widely used as a contact diffusion barrier in silicon ICs. Such use occurs because TiN behaves as an impermeable barrier to silicon and because the activation energy for the diffusion of other impurities into TiN is high (e.g., the activation energy for Cu diffusion into TiN thin films is 4.3 eV, whereas the normal value for diffusion of Cu into metals is only 1 to 2 eV). TiN prevents junction spiking failures that occur when a significant amount of metal diffuses into the silicon, creating a short circuit across the junction. TiN is also chemically and thermodynamically very stable: TiN exhibits one of the lowest electrical resistivities of the transition metal carbides, borides, or nitrides—all of which are chemically and thermally stable compounds.

In another application, TiN is used as an adhesion layer for blanket tungsten films. TiN is deposited after contacts or vias are cut in a dielectric layer. Typical dielectric materials are borophosphosilicate glass (BPSG), thermal oxide, and plasma-enhanced oxide and silicon nitride. Blanket tungsten is next deposited and etched back to form plugs that are coplanar with the top of the dielectric. Then aluminum is deposited and patterned to form the metal interconnection for the integrated circuit. This series of process steps is usually repeated to form three or four levels of metallization. A thin (e.g., 100 nm thick) adhesion layer of TiN is deposited before the tungsten is deposited because extremely poor adhesion exists between tungsten and the typical dielectric materials.

Due to its high conductivity, titanium nitride is also an attractive candidate for forming electrodes in highly dense and complicated structures such as deep trench and stacked capacitor structures. Highly conformal films with low resistivity are needed for advanced device structures with enhanced surface area, such as stacks with hemispherical grains, crowns with grains, deep trenches with grains, and the like. Thin-film TiN meets those needs.

In most applications, it is desired that thin films maintain a uniform thickness and freedom from cracks or voids. As thin films cross steps that occur on the surface of the underlying substrate, they may suffer unwanted deviations from the ideal, such as thinning or cracking. A measure of how well a film maintains its nominal thickness is expressed by the ratio of the minimum thickness of a film as it crosses a step, $t_s$, to the nominal thickness of the film on flat regions, $t_n$. This film property is referred to as the "step coverage" of the film, and is expressed as the percentage of the nominal thickness that occurs at the step: Step Coverage $(\%)=(t_s/t_n)\times 100\%$. Step coverage of 100% is ideal, but each process is normally specified by a lesser minimum value that is acceptable for a given application.

The height of the step and the aspect ratio of the feature being covered also determine the expected step coverage. The greater the height of the step or the greater the aspect ratio (i.e., the height-to-width ratio of a single step or the height-to-spacing ratio of two adjacent steps) of the step, the more difficult it is to cover the step without thinning of the film. Therefore, the worse the expected step coverage. As contact dimensions continue to shrink in microelectronic technology, and aspect ratios continue to increase, the formation of conformal contact layers, liners, barriers, and other structures becomes increasingly difficult.

TiN films may be formed by several different methods, including (1) sputtering titanium onto a substrate and then reacting in nitrogen or ammonia; (2) reactively sputtering titanium in a nitrogen atmosphere; and (3) chemical vapor deposition (CVD). The first two processes are physical and result in line-of-sight trajectories for the deposited material. As a result, coverage of the sidewalls and bottoms of high aspect ratio (i.e., aspect ratios greater than about 1:45) contacts is poor with respect to the top surface of the substrate.

The third process, CVD, deposits a thin film of material onto a substrate by reacting the constituent elements in gaseous phase. CVD processes are used to produce thin, single-crystal films called epitaxial films. CVD allows surface diffusion of the depositing material. The coverage on the sidewalls and bottoms of the high aspect ratio contacts is only equivalent to that on the top surface of the substrate for low aspect ratios. Moreover, for high aspect ratio structures, CVD produces films that have poor conformality with the trench sidewalls.

TiN films are typically formed using the CVD process by reaction of titanium tetrachloride ($TiCl_4$) and ammonia ($NH_3$) in a ratio range of one-to-less than five (1:<5). The two gases are delivered in separate gas lines and mixed in a reaction chamber. Two problems occur with conventional CVD of TiN from $TiCl_4$ at reaction rate limited temperatures. The first is the slow reaction rate, increasing deposition time. More important at these lower temperatures chlorine impurities remain in the deposited film. The chlorine impurities increase the resistance of the TiN film. In addition, the chlorine corrodes metals, especially aluminum, damaging the surface. U.S. Pat. No. 5,378,501 issued to Foster discloses deposition of a TiN film by CVD using $TiCl_4$ and $NH_3$ in a diluent at a temperature less than 550° C. Foster requires the use of special equipment, however, that minimizes the boundary layer thickness over the substrate.

Other deposition processes have their own disadvantages. U.S. Pat. No. 5,840,628 issued to Miyamoto discloses a plasma chemical vapor deposition process. Plasma is a partially ionized gas. To make plasma, a device excites a gas with high radio or microwave frequencies. The plasma then emits light, charged particles (ions and electrons), and neutral active components (atoms, excited molecules, and free radicals). These particles and components bombard substrates brought into the plasma environment. The plasma CVD process disclosed by Miyamoto requires two steps, rather than a single step.

Many solutions have been proposed for depositing TiN in low aspect ratio structures. For example, U.S. Pat. No. 5,918,149 is directed to depositing aluminum or aluminum alloy into small vias holes or trenches. The method of fabrication includes the provision of a trench or via hole in a dielectric, with a barrier layer extending into the trench or via hole. A layer of titanium is provided over the barrier layer, also extending into the trench or via hole, and aluminum or aluminum alloy is provided over the titanium layer. The barrier layer provides good conformal coverage while also preventing outgassing of the dielectric from adversely affecting the conductor. The method includes the following specific steps: (1) providing an oxide dielectric, having a recess, on a wafer; (2) heating the surface of the wafer; (3) depositing a barrier layer of TiN in the recess by a CVD process in which a TiN source material is decomposed into TiN by the heated surface of the wafer; (4) depositing a titanium layer in the recess over the barrier layer, the titanium layer deposited by a physical vapor deposition process to a thickness of less than 200Å; (5) depositing an aluminum seed layer at room temperature in the recess over the titanium layer, wherein the seed layer is between 2,000 and 4,000 Å thick; (6) heating the wafer to 425° C. or less; and (7) depositing a second aluminum layer over the seed layer.

Another example of a solution proposed for low aspect ratio structures is provided by U.S. Pat. No. 5,192,589. Disclosed is a process for creating thin TiN films via CVD. The deposition process is performed in a low-pressure chamber (i.e., a chamber in which pressure has been reduced to between 0.1 and 2 Torr), and uses ammonia and the metal-organic compound tetrakis(dimethylamido) titanium, Ti(NMe$_2$)$_4$, as precursors. Ammonia flow rate in the deposition chamber is maintained at more than approximately thirty times the metal-organic precursor flow rate. Such flow rates result in deposited TiN films having low and relatively constant bulk resistivity over time when exposed to an aerobic environment. In addition, the deposition process is performed at a substrate temperature of at least 200° C., and ideally as high at 450° C. to minimize bulk resistivity of the deposited TiN films.

To overcome the shortcomings of conventional deposition processes, a new process is provided. An object of the present invention is to provide an improved process that achieves deposition of highly conformal, high-quality TiN films on high aspect ratio structures. A related object is to achieve step coverages approaching 100%. Another object is to provide a process that achieves deposition in high aspect ratio structures with low resistance. Still another object is to provide a process that achieves deposition in high aspect ratio structures with acceptable contamination. It is also an object of the present invention to provide a process that does not require the use of special equipment or additional steps when compared to conventional processes.

SUMMARY OF THE INVENTION

To achieve these and other objects, and in view of its purposes, the present invention provides a process for depositing a highly conformal TiN film on a semiconductor substrate surface by CVD. The process includes the following steps: (1) providing a semiconductor substrate having a surface; (2) maintaining the substrate surface at a temperature of about 350° C. to about 800° C.; (3) creating a gaseous reaction mixture comprising titanium tetrachloride, ammonia, and, optionally, a diluent in which the ratio of titanium tetrachloride to ammonia is about 5:1 to 20:1; and (4) passing the gaseous reaction mixture over the semiconductor substrate surface. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1a shows a substrate containing a deep trench with a high aspect ratio on which has been deposited a TiN layer;

FIG. 1b shows a substrate containing a deep trench with a high aspect ratio, a layer of hemispherical grains deposited in the trench, and TiN deposited in the trench and over the hemispherical grains;

FIG. 1c shows a substrate containing a stack capacitor with a high aspect ratio on which TiN has been deposited;

FIG. 1d shows a substrate containing a stack capacitor with a high aspect ratio, a layer of hemispherical grains deposited on the structure, and TiN deposited on the structure and over the hemispherical grains;

FIG. 1e shows a substrate containing a complicated stack structure with a high aspect ratio on which has been deposited TiN;

FIG. 2b is a SEM of the bottom portion of the trenches shown in FIG. 2a.

DETAILED DESCRIPTION OF THE INVENTION

Figure 1A:
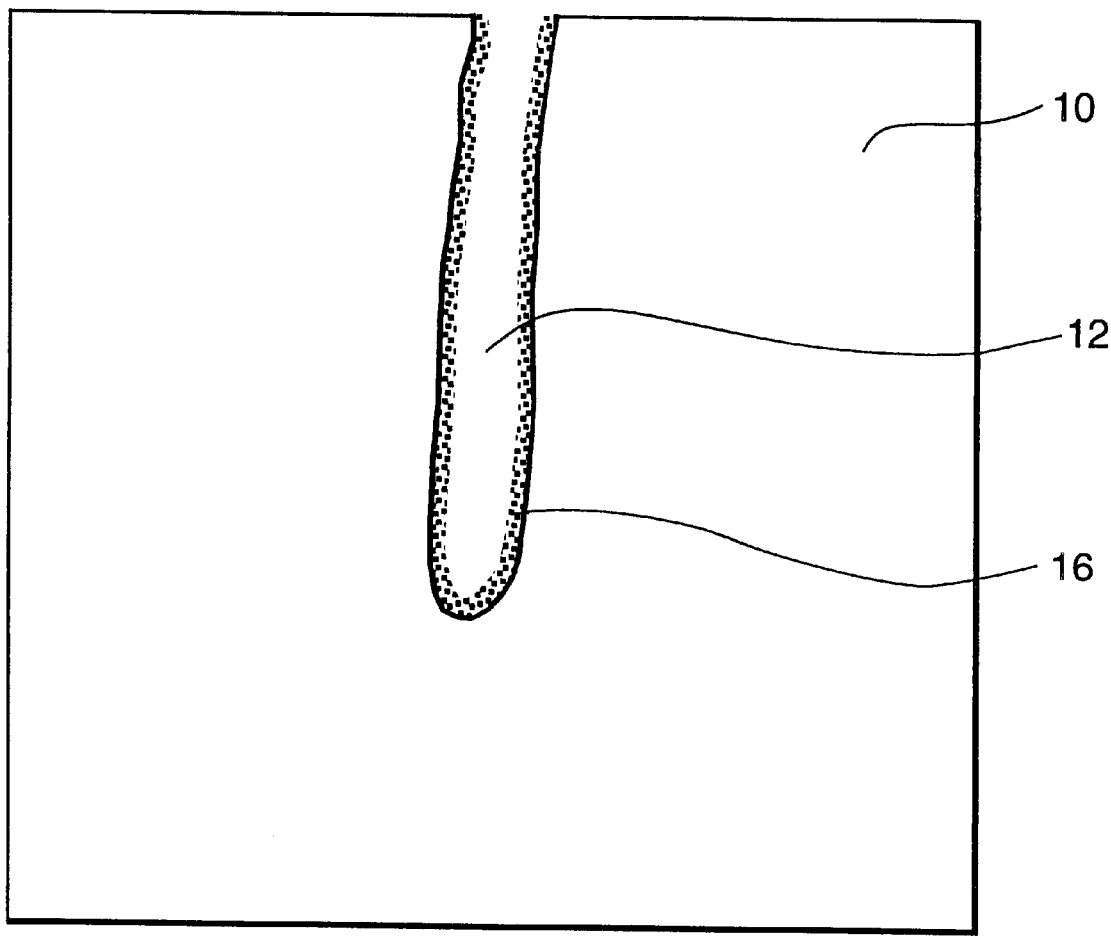
FIGS. 1a through 1e provide examples illustrating the type of structures that can be filled with TiN advantageously using the process of the present invention and, more specifically.

Throughout the specification, similar reference numbers refer to similar elements in all figures of the drawing. The invention is a process for depositing highly conformal, high quality TiN films by low-temperature CVD that have very low bulk resistivity and excellent step coverage. The TiN layer has a chloride content of less than 5%. The process described is generic and can be easily extended to other metal and metal nitride systems with minor modifications. All of the values given are for a single wafer apparatus, but a furnace can also be used with minor modifications. Moreover, the invention is not limited to constructions of any particular shape or to any memory devices alone.

In a typical CVD process, the substrate on which deposition is desired is placed in a reaction chamber and is heated to a temperature sufficient to cause decomposition of the vapors of the precursor complex. These vapors are introduced into the reaction chamber and transported to the vicinity of the substrate. The vapors then decompose on the substrate, depositing a film of the desired material on the substrate.

The reaction itself uses at least two reactants: titanium tetrachloride (TiCl$_4$) and ammonia (NH$_3$). Titanium tetrachloride and ammonia are used in a ratio of about 5:1 to about 20:1 (volume to volume), preferably about 8:1 to about 15:1, more preferably about 10:1, in contrast to the ratios of less than about 5:1 used in conventional processes. Although not necessary or preferred for the CVD, up to about a ten-fold excess of diluent may be used if desired. The diluent may be a gas such as helium, argon, hydrogen, or nitrogen.

The chemical vapor deposition may be carried out in a conventional vapor deposition system, such as is well-known to those skilled in the art. The semiconductor substrate surface is held at a temperature less than about 880° C., typically about 350° C. to about 650° C., and preferably about 450° C. to 550° C. The total gas flow rate should be from about 100 sccm to about 1,000 sccm and the inlet gas temperature should be about 150° C.

The high degree of conformality achieved by the process of the present invention allows the process to fill complicated, three-dimensional structures with TiN without forming a large seam or void. Titanium nitride can be readily deposited on hard-to-reach surfaces. FIGS. 1a through 1e illustrate the types of three-dimensional structures on which a layer of TiN can be deposited by the process.

FIG. 1a shows a substrate 10 containing a deep trench 12 with a high aspect ratio into which TiN layer 16 has been deposited. TiN layer 16 is deposited using the process according to the present invention. Preferably deep trench 12 has an aspect ratio of at least about 40:1, more preferably at least about 45:1, and even more preferably about 45:1 to about 160:1. The preparation of deep trench structures with aspect ratios greater than 45:1, as well as other similar high aspect ratio structures, is well known to those skilled in the art.

Figure 1B:
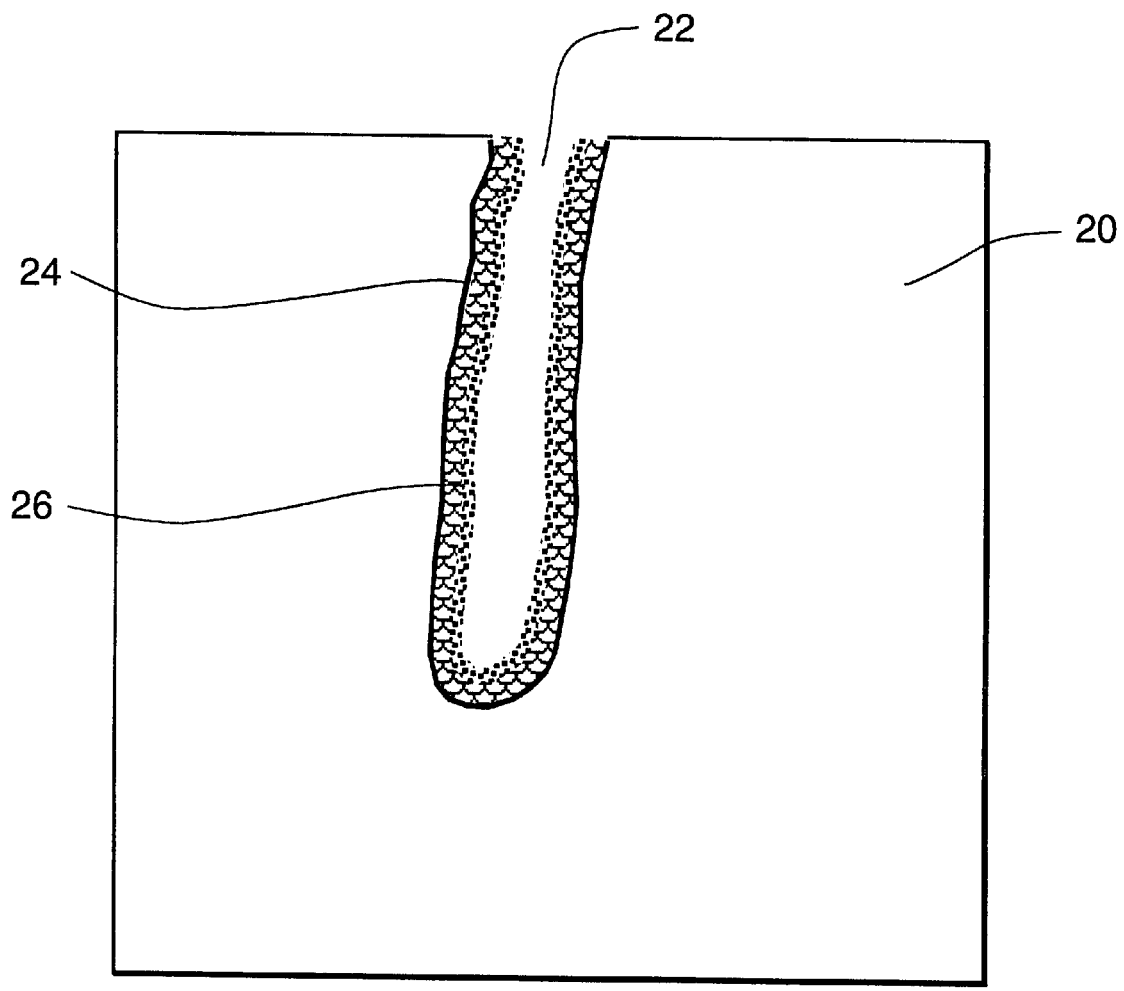

FIG. 1b shows a substrate 20 containing a deep trench 22 with a high aspect ratio. A layer of hemispherical grains (HSG) 24 has been deposited or grown in deep trench 22. HSG 24 roughen the surface of deep trench 22 and, therefore, increase the effective surface area and accordingly increase the capacitance. A TiN layer 26 has been deposited in deep trench 22 and over HSG 24 using the process according to the present invention.

The deposition or growth of hemispherical grains on or in structures is disclosed in U.S. Pat. No. 5,366,917 issued to Watanabe. Watanabe discloses that a polycrystalline silicon layer having a surface with microroughness can be formed based on the grain growth of silicon. One disclosed method includes depositing silicon on a substrate, in accordance with an LPCVD method or the like, at the temperature (referred to as transition temperature) at which the crystal state of the deposited film makes transition from the amorphous phase to the polycrystalline phase. Another method is one in which an amorphous silicon (a-Si) film is formed on a substrate in a vacuum or in an inert gas such as a nitrogen gas, then the sample is subjected to a heating (annealing) treatment at a temperature above the transition temperature again in a vacuum or in an inert gas such as a nitrogen gas. In accordance with such methods, it is possible to form a polycrystalline silicon film having a surface with microroughness by an exclusive use of a CVD method or the combination of a CVD method and annealing that are wall-known techniques in the fabrication of semiconductors.

Figure 1C:
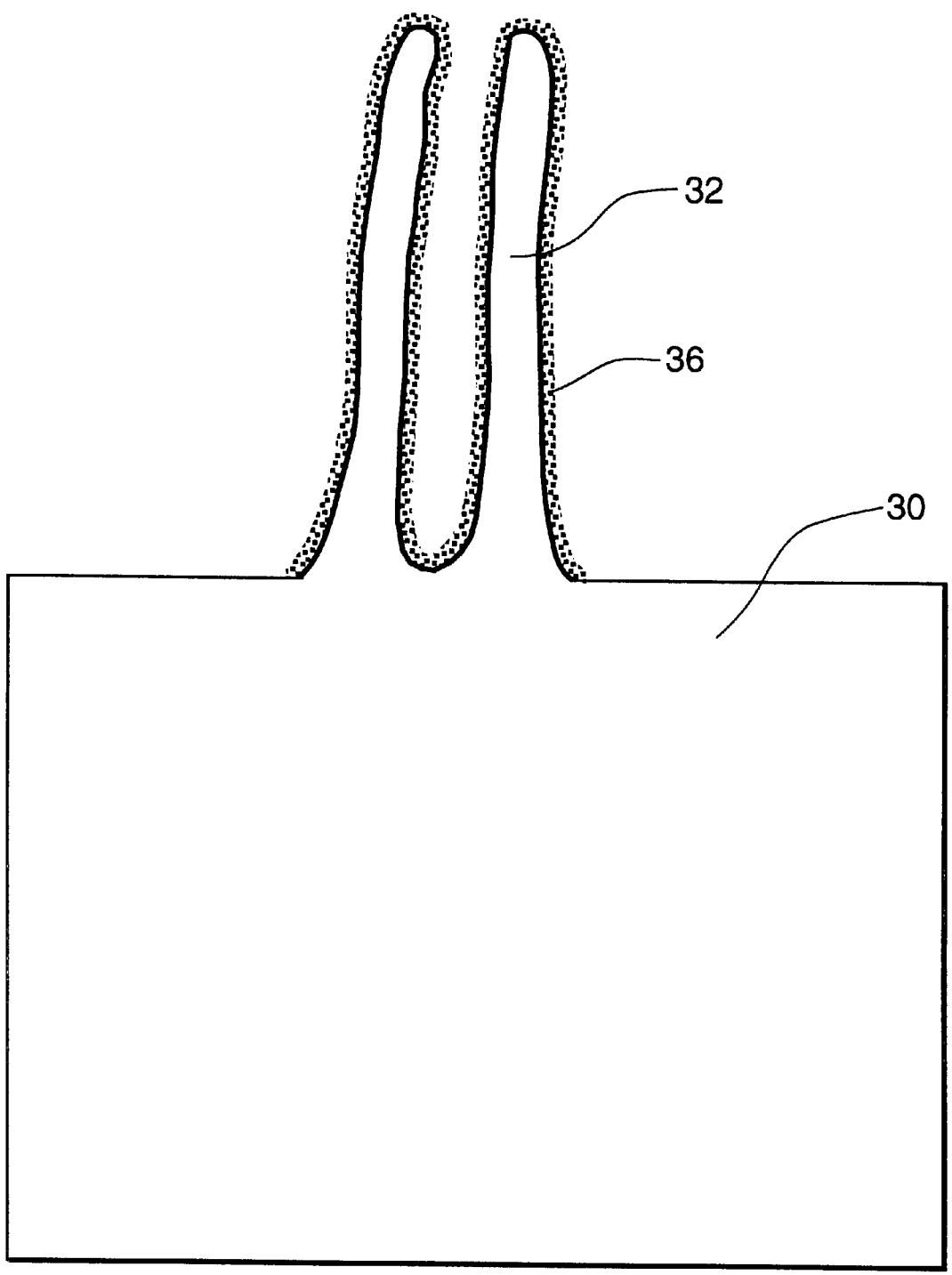

FIG. 1c shows a substrate 30 containing a stack capacitor 32 with a high aspect ratio on which has been deposited a TiN layer 36. TiN layer 36 is deposited using the process according to the present invention, Preferably stack capacitor 32 has an aspect ratio of at least about 4:1. The preparation of stack capacitor structures with an aspect ratio of at least 4:1 is well known to those skilled in the art.

Figure 1D:
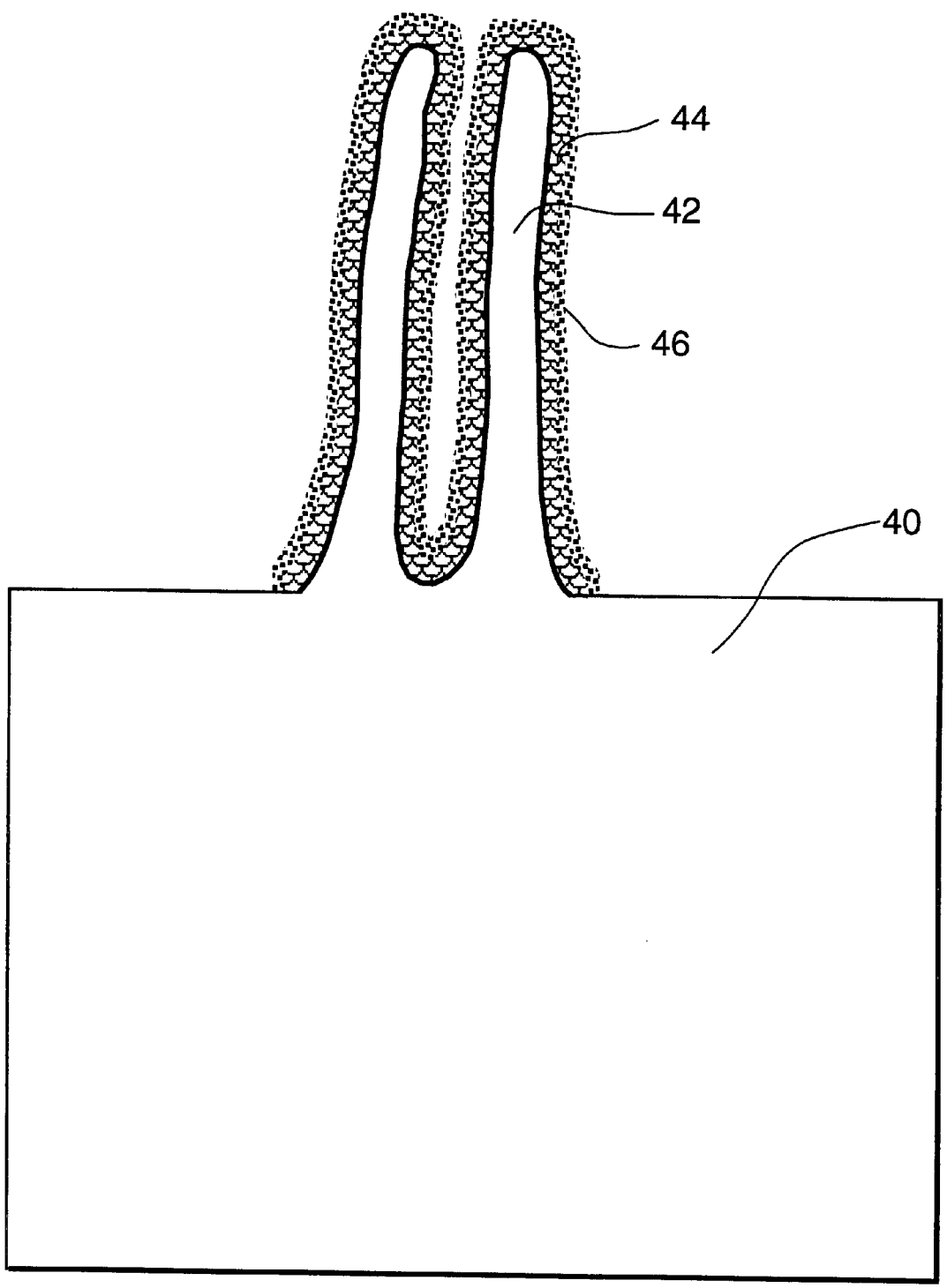

FIG. 1d shows a substrate 40 containing a stack capacitor 42 with a high aspect ratio. A layer of hemispherical grains (HSG) 44 has been deposited on the structure to increase the effective surface area and accordingly increase the capacitance. A TiN layer 46 has been deposited over the structure and over the hemispherical grains using the process according to the present invention. The process of the invention can also be used to deposit a TiN layer on concentric pillars with a high aspect ratio.

Figure 1E:
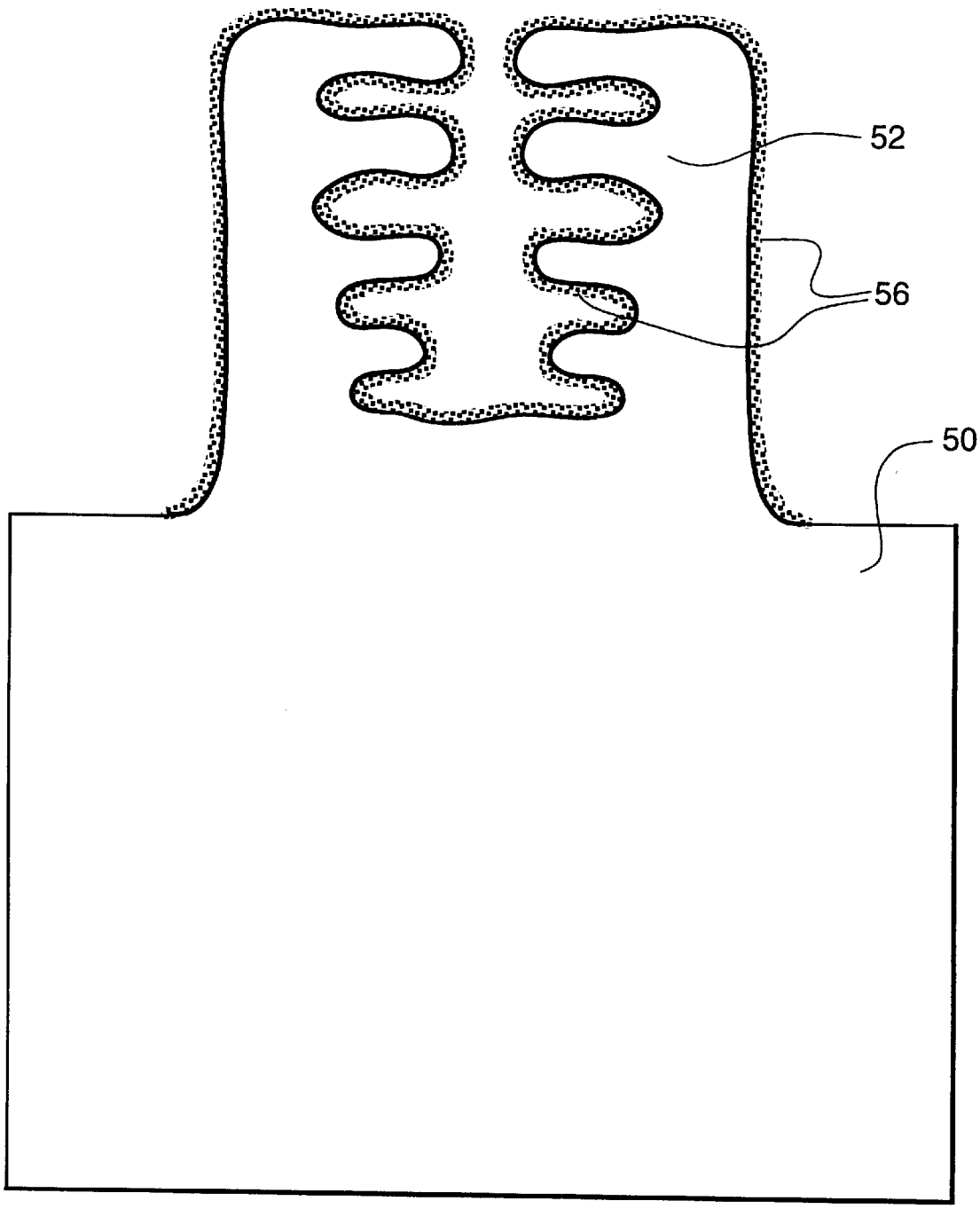

FIG. 1e shows a substrate 50 containing a complicated stack structure 52 with a fine or comb-like structure with a high aspect ratio. A TiN layer 56 has been deposited over the structure using the process according to the present invention.

Applying the process of the present invention, step coverage of 60% to 100% can be achieved for trenches with high aspect ratios. Highly conformal TiN films can be deposited in deep trenches with aspect ratios greater than 10:1, especially in trenches with an aspect ratio of about 45:1 or greater, preferably in trenches with aspect ratios from about 45:1 to about 160:1.

INDUSTRIAL APPLICABILITY

The process of the invention can be used to form contact fines or barriers in high aspect ratio vias, contact holes, and plugs. The process can also be used to form TiN electrodes for capacitors in high aspect ratio deep trenches and stack capacitor structures. These devices and structures are used in the manufacture of semiconductor devices, which are used in, for example, digital computers.

EXAMPLE

The following example is included to more clearly demonstrate the overall nature of the invention. This example is exemplary, not restrictive, of the invention. TiN was formed by reaction of titanium tetrachloride with ammonia. The reaction was carried out in an Applied Materials single wafer tool chemical vapor deposition system.

Titanium tetrachloride/ammonia ratios (volume to volume) in the range of 5:1 to 20:1 were used. Each gas was delivered in a separate gas line. The gases were mixed in the reaction chamber of the CVD apparatus. Pressures in the range of 0.0001 torr to 50 torr and temperatures in the range of 350° C. to 800° C. were investigated. Conformal TiN was produced over a wide range of process conditions as long as the conditions were controlled within the specified reaction regime.

Figure 2A:
FIG. 2a is a scanning electron micrograph (SEM) of the top portion of trenches, with an aspect ratio of about 40:1, following the deposition of TiN in the trenches using the process of the present invention.
Figure 2B:

At 500° C. and 4 torr (ammonia =50 sccm and titanium tetrachloride =500 sccm), excellent step coverage was obtained. The chloride content of the TiN layer was less than 5%. FIGS. 2a and 2b show deposition of TiN in trenches having an aspect ratio of about 40:1 under these conditions. FIG. 2a shows the top portion of the trenches. FIG. 2b shows the bottom of the trenches. The silicon substrate 60 comprises two trenches 62 and 64. Uniform, highly conformal films of TiN 66 and 68 are formed on both the sidewalls and bottoms of trenches 62 and 64.

Although the invention has been particularly shown and described with reference to the preferred embodiments, those skilled in the art will appreciate that various modifications and changes in form and details may be made without departing from the spirit and scope of the invention. For example, in the preceding description specific details are set forth to provide a more thorough understanding of the invention, but it will be apparent to those skilled in the art that the invention may be practiced without using these specific details.

Having described the invention, we now claim the following and their equivalents.

What is claimed is:

1. A chemical vapor deposition process for depositing a highly conformal titanium nitride film on a semiconductor substrate surface, the process comprising the steps of:

providing a semiconductor substrate having a surface with a feature having an aspect ratio of at least 10:1;

maintaining the substrate surface at a temperature of about 450° C. to about 800° C.;

creating a gaseous reaction mixture including titanium tetrachloride and ammonia in which the ratio of titanium tetrachloride to ammonia is about 5:1 to 20:1; and passing the gaseous reaction mixture over the semiconductor substrate surface and depositing a highly conformal titanium nitride film on the semiconductor substrate surface including the feature.

2. The process of claim 1 in which the gaseous reaction mixture further includes a diluent.

3. The process of claim 1 in which the ratio of titanium tetrachloride to ammonia is about 8:1 to 15:1.

4. The process of claim 1 in which the gaseous reaction mixture has a flow rate of about 100 sccm to about 1,000 sccm.

5. The process of claim 1 in which the temperature of the semiconductor substrate surface is maintained at about 450° C. to about 650° C.

6. The process of claim 5 in which the ratio of titanium tetrachloride to ammonia is about 8:1 to 15:1.

7. The process of claim 6 in which the temperature of the semiconductor substrate surface is maintained at about 450° C. to about 550° C.

8. The process of claim 5 in which the ratio of titanium tetrachloride to ammonia is about 10:1.

9. The process of claim 1 in which the feature is a trench having an aspect ratio of at least 40:1.

10. The process of claim 9 in which the ratio of titanium tetrachloride to ammonia is about 8:1 to 15:1.

11. The process of claim 10 in which the gaseous reaction mixture has a flow rate of about 100 sccm to about 1,000 sccm.

12. The process of claim 11 in which the temperature of the semiconductor substrate surface is maintained at about 450° C. to about 650° C.

13. The process of claim 12 in which the gaseous reaction mixture has a flow rate of about 550 sccm.

14. The process of claim 1 in which the gaseous reaction mixture does not include a diluent.

15. The process of claim 14 in which the ratio of titanium tetrachloride to ammonia is about 8:1 to 15:1.

16. The process of claim 15 in which the feature is a trench having an aspect ratio of at least 40:1.

17. The process of claim 15 in which the feature is a stack capacitor.

18. The process of claim 15 in which the temperature of the semiconductor substrate surface is maintained at about 450° C. to about 650° C.

19. The process of claim 18 in which the ratio of titanium tetrachloride to ammonia is about 10:1.

20. The process of claim 19 in which the gaseous reaction mixture has a flow rate of about 100 sccm to about 1,000 sccm.

21. The process of claim 20 in which the feature is a stack capacitor.

22. The process of claim 20 in which the feature is a trench having an aspect ratio of at least 40:1.

* * * * *